(12) United States Patent
Horiguchi et al.

(10) Patent No.: US 9,334,429 B2
(45) Date of Patent: May 10, 2016

(54) UNDERFILL SEALANT COMPOSITION

(71) Applicant: HENKEL AG & CO. KGAA, Duesseldorf (DE)

(72) Inventors: Yusuke Horiguchi, Yokohama (JP); Mieko Sano, Yokohama (JP); Kenichiro Sato, Yokohama (JP)

(73) Assignee: Henkel AG & Co. KGaA, Duesseldorf (DE)

( * ) Notice: Subject to any disclaimer, the term of this patent is extended or adjusted under 35 U.S.C. 154(b) by 0 days.

(21) Appl. No.: 14/200,871

(22) Filed: Mar. 7, 2014

(65) Prior Publication Data
US 2014/0187729 A1  Jul. 3, 2014

Related U.S. Application Data

(63) Continuation of application No. PCT/JP2012/072985, filed on Sep. 7, 2012, which is a continuation of application No. PCT/JP2011/070652, filed on Sep. 9, 2011.

(51) Int. Cl.
| | |
|---|---|
| *C09J 133/14* | (2006.01) |
| *H01L 21/56* | (2006.01) |
| *H01L 23/00* | (2006.01) |
| *H01L 23/29* | (2006.01) |
| *C09D 4/06* | (2006.01) |
| *C09D 135/00* | (2006.01) |

(52) U.S. Cl.
CPC ............ *C09J 133/14* (2013.01); *C09D 4/06* (2013.01); *C09D 135/00* (2013.01); *H01L 21/563* (2013.01); *H01L 23/293* (2013.01); *H01L 24/29* (2013.01); *H01L 2224/16225* (2013.01); *H01L 2224/2919* (2013.01); *H01L 2224/32225* (2013.01); *H01L 2224/73204* (2013.01)

(58) Field of Classification Search
CPC ....... C09D 135/00; C09D 4/06; C09J 133/14; H01L 21/563; H01L 23/293; H01L 24/29; H01L 2224/16225; H01L 2224/2919; H01L 2224/32225; H01L 2224/73204

USPC .................................................. 526/262, 312
See application file for complete search history.

(56) References Cited

U.S. PATENT DOCUMENTS

| | | | |
|---|---|---|---|
| 5,973,166 A | 10/1999 | Mizori et al. | |
| 6,410,611 B1 | 6/2002 | Sakurai et al. | |
| 7,474,008 B2 | 1/2009 | Fukuta et al. | |
| 8,088,308 B2 | 1/2012 | Okubo et al. | |
| 8,652,335 B2 | 2/2014 | Pears et al. | |
| 2001/0021547 A1 | 9/2001 | Sakairi | |
| 2007/0299181 A1* | 12/2007 | Nakata et al. | ........... 524/394 |
| 2011/0160339 A1 | 6/2011 | Jeong et al. | |
| 2011/0237028 A1 | 9/2011 | Hamazaki et al. | |

FOREIGN PATENT DOCUMENTS

| | | | | |
|---|---|---|---|---|
| JP | 56155214 | | 12/1981 | |
| JP | 4202514 A | | 7/1992 | |
| JP | 08213517 A | | 8/1996 | |
| JP | 10178065 | | 6/1998 | |
| JP | 2001237006 | | 8/2001 | |
| JP | 2001302736 | | 10/2001 | |
| JP | 2001302736 A | | 10/2001 | |
| JP | 2005333085 | | 12/2005 | |
| JP | 2008502470 | | 1/2008 | |
| JP | 200881713 A | | 4/2008 | |
| JP | 2008098646 | | 4/2008 | |
| JP | 2009074066 | | 4/2009 | |
| JP | 2009256581 | | 11/2009 | |
| JP | 2009256582 | | 11/2009 | |
| JP | 2010-176076 | * | 8/2010 | ........... G03F 7/004 |
| JP | 2010176076 | | 8/2010 | |
| JP | 2010226098 A | | 10/2010 | |
| JP | 2011052109 | | 3/2011 | |

\* cited by examiner

*Primary Examiner* — Ling Choi
*Assistant Examiner* — Chun-Cheng Wang
(74) *Attorney, Agent, or Firm* — Steven C. Bauman

(57) ABSTRACT

The present invention provides a composition which does not cause the problem of use at high temperature in the mounting process of electronic device. The present invention relates to an underfill sealant composition comprising (a) a (meth) acrylic compound and (c) an isocyanuric acid having an allyl group.

7 Claims, No Drawings

UNDERFILL SEALANT COMPOSITION

CROSS-REFERENCE TO RELATED APPLICATIONS

This application is a continuation of International Patent Application No. PCT/JP2012/072985 filed Sep. 7, 2012, which claims priority to International Patent Application No. PCT/JP2011/070652, filed Sep. 9, 2011, the contents of both of which are incorporated herein by reference.

FIELD OF THE INVENTION

The present invention relates to a composition to be usable for producing an electronic device, particularly a semiconductor device, and use of the same.

BACKGROUND OF THE INVENTION

As a mounting technology for a semiconductor chip, a flip chip technology, by which a semiconductor chip is directly connected onto a substrate has been known. In the flip chip mounting, a semiconductor chip and a circuit substrate are connected by means of electrodes (bumps) formed on the element formation surface side of the semiconductor chip. On this occasion, for the sake of reinforcement of the bonding parts and enhancement of the reliability of the connections, an underfill sealant, which is an adhesive composition, is generally filled between the semiconductor chip and the wiring substrate.

As an underfill composition, adhesive compositions containing an epoxy-based compound and/or a (meth)acrylic compound or the like have been known (e.g. Japanese Patent Laid-Open No. 2010-226098). Among them, a composition utilizing a radical curing reaction of a (meth)acrylic compound has an advantage over a composition containing an epoxy-based compound that the reaction rate is higher and the efficiency in producing an electronic device can be enhanced.

Meanwhile, various additives, such as an antioxidant and a metal ion binder, are mixed as needed, into an underfill composition. By this means, the quality of an electronic device can be enhanced by, for example, improving mechanical strength, adhesiveness, a rate of cross-linking and the like (Japanese Patent Laid-Open No. H08 (1996)-213517).

As a method for filling an underfill sealant, it has been known that a method in which a liquid adhesive composition is first applied on a wiring substrate and then a semiconductor chip is mounted to conduct simultaneously electrode connection and sealing; a method (a so-called capillary method) in which electrical connection between an electrode on a semiconductor chip and a substrate is first established and then a liquid adhesive composition is applied on a side or a plurality of sides of the chip for sealing the gap between the wiring substrate and the semiconductor chip by capillarity and the like. By any of the methods, it is required to apply a liquid adhesive composition all over the wiring substrate, to fill the liquid adhesive composition uniformly in the gap between the semiconductor chip and the wiring substrate, and the like. Therefore, occasionally, a syringe, the substrate and the like are heated to room temperature or higher as needed in order to increase flowability of the adhesive composition.

However, when an underfill sealant utilizing a radical curing reaction is used, there has been a problem in that a curing reaction of an underfill sealant composition may occasionally progress prematurely before carrying out sealing, which leads to inadequate electrode connection or poor work efficiency. Such a problem tends to occur when an adhesive composition is in a state at room temperature or higher, as described above. In order to overcome the problem, whereas an additive is mixed in an underfill sealant composition or the working temperature is lowered, it has not been sufficient. Consequently, further improvement of an adhesive composition to be used for an electronic device has been sought after.

DETAILED DESCRIPTION OF THE INVENTION

An object of the present invention is to solve the aforedescribed problems in using a conventional adhesive composition and to provide a composition which improves productivity of electronic devices. Further, another object is to provide an electronic device or an electronic appliance containing the composition.

The present invention relates to the following items.
1. An underfill sealant composition comprising:
   (a) a (meth)acrylic compound and
   (c) an isocyanuric acid having an allyl group.
2. The composition according to the above item 1, further comprising (b) a maleimide compound.
3. The composition according to the above item 2, wherein the maleimide compound (b) comprises a bismaleimide.
4. The composition according to any one of the above items 1 to 3, further comprising a radical initiator.
5. The composition according to any one of the above items 1 to 4 comprising:
   10-90 wt % of the (meth)acrylic compound (a) based on the total weight of the composition and
   0.001-20 wt % of the isocyanuric acid having an allyl group (c) based on the total weight of the composition.
6. The composition according to any one of the above items 2 to 5, comprising 0.1-50 wt % of the maleimide compound (b) based on the total weight of the composition.
7. The composition according to any one of the above items 1 to 6, which is used in flip chip mounting.
8. An electronic device comprising a cured product of the composition according to any one of the above items 1 to 7.
9. An electronic appliance comprising the electronic device according to the above item 8.

The progress of the curing reaction of a composition according to the present invention at room temperature or higher and 80° C. or lower can be suppressed adequately. Therefore, the composition of the present invention does not cause a defective electrode connection during flip chip mounting of a semiconductor chip, and sufficient working time in a mounting process can be secured. As the result, a higher quality product can be provided without decreasing the production efficiency of an electronic device by flip chip mounting.

A composition for an electronic device according to the present invention contains at least
(a) a (meth)acrylic compound, and
(c) an isocyanuric acid having an allyl group. The respective components will be described below.

<(a) (Meth)acrylic Compound>

A (meth)acrylic compound to be used according to the present invention may have one or more (meth)acryloyl groups, and has preferably two or more (meth)acryloyl groups. Ordinarily, it is preferable that a compound having one (meth)acryloyl group and/or a compound having three or more (meth)acryloyl groups is used as needed in addition to a compound having two (meth)acryloyl groups. Further, the (meth)acrylic compound may be a monomer or an oligomer.

Although there is no particular restriction on a (meth)acrylic compound usable for the present invention, examples of monofunctional compounds having a (meth)acryloyl group include phenylphenol acrylate, methoxypolyethylene acrylate, acryloyloxyethyl succinate, a aliphatic acrylate, methacryloyloxyethyl phthalic acid, phenoxyethylene glycol methacrylate, a aliphatic methacrylate, β-carboxyethyl acrylate, isobornyl acrylate, isobutyl acrylate, tert-butyl acrylate, hydroxyethyl acrylate, hydroxypropyl acrylate, dihydrocyclopentadiethyl acrylate, cyclohexyl methacrylate, tert-butyl methacrylate, dimethylaminoethyl methacrylate, diethylaminoethyl methacrylate, tert-butylaminoethyl methacrylate, 4-hydroxybutyl acrylate, tetrahydrofurfuryl acrylate, benzyl acrylate, ethylcarbitol acrylate, phenoxyethyl acrylate, and methoxytriethylene glycol acrylate. Examples of compounds having two or more (meth)acryloyl groups include hexanediol dimethacrylate, hydroxyacryloyloxypropyl methacrylate, hexanediol diacrylate, urethane acrylate, epoxy acrylate, bisphenol A-type epoxy acrylate, modified epoxy acrylate, fatty acid-modified epoxy acrylate, amine-modified bisphenol A-type epoxy acrylate, allyl methacrylate, ethylene glycol dimethacrylate, diethylene glycol dimethacrylate, ethoxylated bisphenol A dimethacrylate, tricyclodecane dimethanol dimethacrylate, glycerine dimethacrylate, polypropylene glycol diacrylate, propoxylated ethoxylated bisphenol A diacrylate, 9,9-bis(4-(2-acryloyloxyethoxy)phenyl)fluorene, tricyclodecane diacrylate, dipropylene glycol diacrylate, polypropylene glycol diacrylate, propoxylated neopentyl glycol diacrylate, tricyclodecane dimethanol diacrylate, 1,12-dodecanediol dimethacrylate, trimethyloipropane trimethacrylate, dipentaerythtol polyacrylate, dipentaerythtol hexaacrylate, trimethyloipropane triacrylate, trimethylolpropane ethoxytriacrylate, polyether triacrylate, glycerine propoxy triacrylate, pentaerythritol tetraacrylate, pentaerythritolethoxy tetraacrylate, ditrimethylol propane tetraacrylate, monopentaerythritol acrylate, dipentaerythritol acrylate, tripentaerythritol acrylate, polypentaerythritol acrylate, and pentaerythritol triacrylate.

Examples of commercial products of a (meth)acrylic compound usable for the present invention include functional monomers of SR&CD series, functional epoxy acrylate oligomers and functional urethane acrylate oligomers of CN series from Sartomer, Co., Inc., Light Ester series, and Light Acrylate series from Kyoeisha Chemical Co., Ltd., and NK Ester from Shin-Nakamura Chemical Co., Ltd.

The (meth)acrylic compounds may be used singly or in a combination of two or more kinds thereof.

The content of a (meth)acrylic compound in accordance with the present invention may be adjusted depending on the purpose of use, and is preferably from 10 to 90% by weight based on the total weight of a compound, and more preferably from 20 to 60% by weight. If the content of a (meth)acrylate is within the range, the viscosity of a composition before curing is low, and is superior in workability, and also in strength after curing.

<(c) Isocyanuric Acid Having an Allyl Group>

The composition according to the present invention contains an isocyanuric acid represented by the following formula (II).

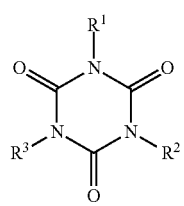

(II)

In the formula II, $R^1$, $R^2$, and $R^3$ each independently represent hydrogen or a substituent having 1 to 50 carbon atoms, and at least one of $R^1$, $R^2$, and $R^3$ is a substituent having an allyl group represented by —$CH_2$—$CH$=$CH_2$.

Although there is no particular restriction on the substituent having an allyl group, examples of the same include:

   (III)

wherein, n represents an integer of 1 or more, preferably an integer from 1 to 18, more preferably an integer from 1 to 10, and particularly preferably 1,

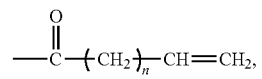

wherein n represents an integer from 1 to 17,

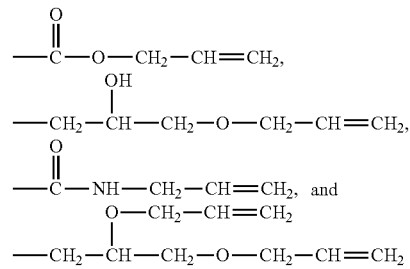

An isocyanuric acid used for the composition according to the present invention includes at least one allyl group, and may include two or more, or three or more of the same. At least one substituent out of the three substituents $R^1$, $R^2$, and $R^3$ is a substituent including an allyl group, and two or three substituents may include an allyl group. Further, a single substituent may include a plurality of allyl groups.

When any of $R^1$, $R^2$, and $R^3$ is a substituent not including an allyl group, the substituent is hydrogen or a substituent having 1 to 50 carbon atoms, and there is no particular restriction thereto as long as the object of the present invention is not impaired. Examples of a substituent not having an allyl group include an alkyl group having 1 to 50 carbon atoms, preferably an alkyl group having 1 to 20 carbon atoms, such as a methyl group, an ethyl group, a propyl group, and a butyl group, a phenyl group, a benzyl group, a phenethyl group, a vinyl group, and a glycidyl group,

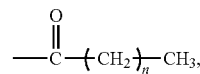

wherein n represents an integer from 0 to 19,

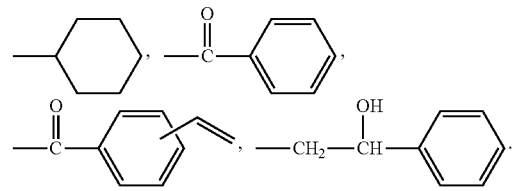

Although there is no particular restriction on an isocyanuric acid having an allyl group to be used in the present invention, examples thereof include triallyl isocyanurate, trimethallyl isocyanurate, diallyl monoglycidyl isocyanurate, 1-allyl-3,5-diglycidyl isocyanurate, diallyl isocyanurate, and diallyl propyl isocyanurate.

Examples of commercial products of an isocyanuric acid having an allyl group to be used according to the present invention include TAIC (registered trade mark) series from Nippon Kasei Chemical Co., Ltd., and isocyanuric acid derivatives, such as MeDAIC, DA-MGIC, and MA-DGIC from Shikoku Chemicals Corporation.

The isocyanuric acids having an allyl group may be used singly or in combinations of two or more thereof.

When the composition according to the present invention is used for producing a semiconductor device, the composition is, for example, applied on a wiring substrate as described below. In such an event, the composition is occasionally put in a state at room temperature or higher in order to increase flowability of the composition. On this occasion, since the composition according to the present invention contains an isocyanuric acid having an allyl group, the progress of the curing reaction is suppressed adequately and the work efficiency at a succeeding mounting process is not decreased. This is because, as presumed by the inventors, an isocyanuric acid having an allyl group stabilizes radicals generated by the (meth)acrylic compound in a mounting process of an electronic device and the progress of the radical polymerization reaction is suppressed thereby. In addition, the composition according to the present invention does not cause any problem in a reaction at another process in producing an electronic device, or physical properties of an adhesive to be obtained finally.

Although there is no particular restriction on the content of an isocyanuric acid having an allyl group in the composition according to the present invention, it is preferably from 0.001 to 20% by weight based on the total weight of the composition, and more preferably from 0.1 to 10% by weight.

<(b) Maleimide Compound>

A composition according to the present invention may preferably contain further a (b) maleimide compound in addition to the (a) (meth)acrylic compound and the (c) an isocyanuric acid having an allyl group. Although there is no particular restriction on a maleimide compound to be contained in a composition according to the present invention, examples thereof include the following compounds.

A maleimide compound has at least one, preferably one or two following moiety (I) in the molecule.

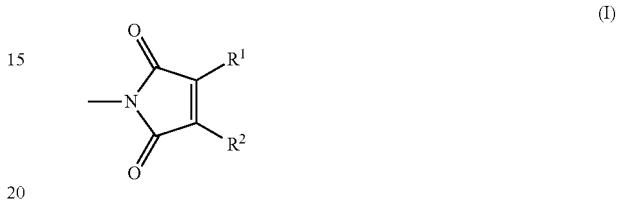

(I)

In the formula, $R^1$ and $R^2$ represent H, or a alkyl group having 1 to 6 carbons; or $R^1$ and $R^2$ together represent an alkylene group having 2 to 6 carbons. Preferably $R^1$ and $R^2$ are both H; or $R^1$ and $R^2$ together represent a 1,4-butylene group.

The maleimide compound is preferably liquid at room temperature and therefore the moiety (I) bonds to a group that allows the maleimide compound to be liquid, for example, an organic group having a branched alkyl, alkylene, alkylene oxide, alkylene carboxyl, or alkylene amide structure having sufficient length and branches to render the maleimide compound liquid. The maleimide compound may have one, or two or more structures (I). The compound having two of these groups is a bismaleimide compound. In addition, a maleimide compound, even if it is not liquid, may be used if the composition becomes liquid as being mixed with another maleimide compound or mixed with another component.

Examples of a maleimide compound, in which the moiety (I) bonds to an alkyl group or an alkylene group (the groups may have a double bond, or a saturated aliphatic ring), include the following compounds.

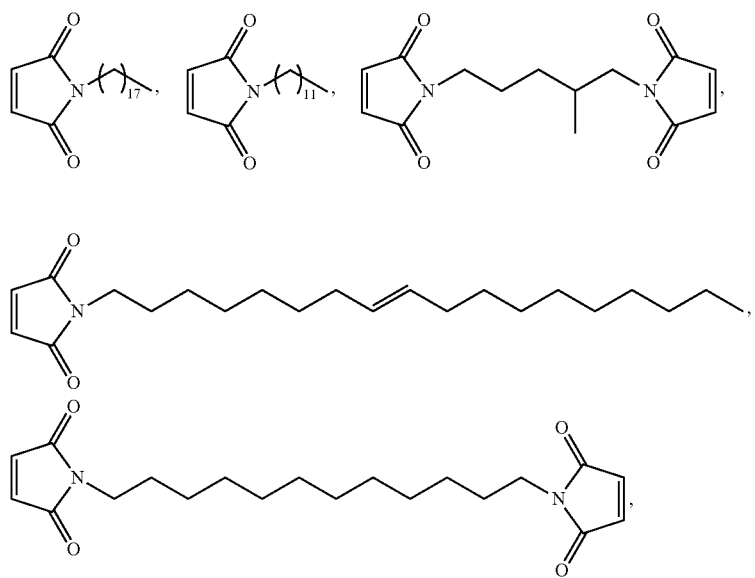

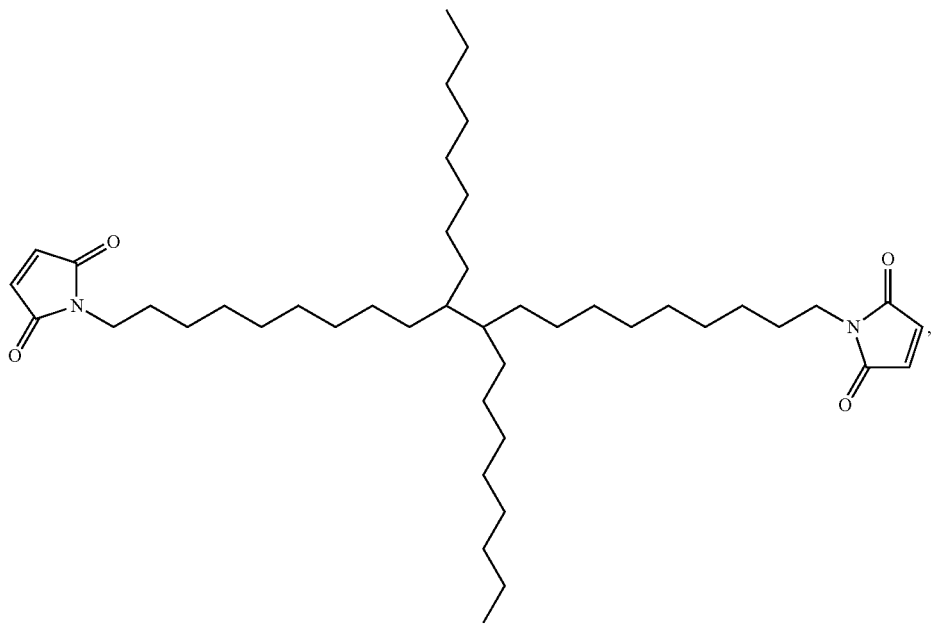

(X-1)

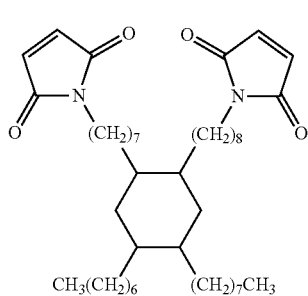

(X-2)

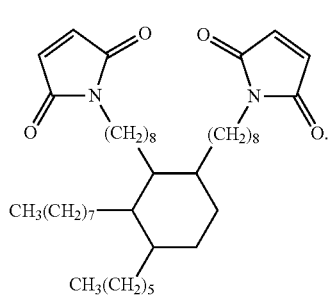

(X-3)

Particularly preferable examples include stearyl maleimide, oleyl maleimide, behenyl maleimide, and a 1,20-bismaleimide derivative of 10,11-dioctyleicosane, as well as a combination thereof. A 1,20-bismaleimide derivative of 10,11-dioctyleicosane is available from Henkel AG & Co. under a product name of X-BMI, which is synthesized from 1,20-diamino-10,11-dioctyl-eicosane and/or a diamine of a cyclic isomer thereof by a method according to U.S. Pat. No. 5,973,166 (the entire disclosures of U.S. Pat. No. 5,973,166 are incorporated herein by reference). X-BMI contains one, or two or more of 1,20-bismaleimide-10,11-dioctyl-eicosane [compound denoted by Formula (X–1)], 1-heptylene maleimide-2-octylene maleimide-4-octyl-5-heptylcyclohexane [compound denoted by Formula (X–2)], 1,2-dioctylene maleimide-3-octyl-4-hexylcyclohexane [compound denoted by Formula (X–3)], and the like. Bismaleimide compounds denoted by formulas (X–1) to (X–3) may be also preferably used solely.

Examples of a maleimide compound, in which the moiety (I) is bonded with a group having an alkylene oxide structure, include the following compounds.

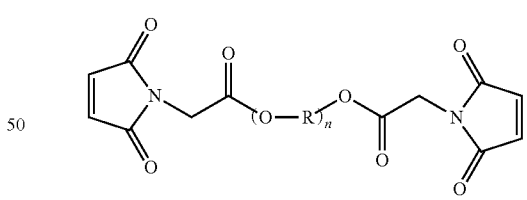

In the formula, R is an alkylene group, preferably ethylene or 1,2-propylene, and n is an integer from 2 to about 40, wherein the magnitude of an integer and the distribution of n to render the compound liquid are selected preferably. The compound is available from DIC Corporation as LUMICURE (registered trademark) MIA200.

Examples of another usable maleimide compound include a compound (3,4,5,6-tetrahydrophthaloimide ethyl acrylate) denoted by the following formula.

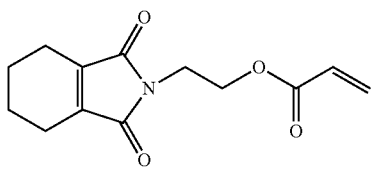 [SMILES: C=CC(=O)OCCN1C(=O)C2=C(CCCC2)C1=O]

The above maleimide compounds may be used singly or in a combination of two or more kinds thereof.

The content of a maleimide compound in accordance with the present invention is preferably from 0 to 50% by weight based on the total weight of a composition, more preferably from 0.1 to 50% by weight, and further preferably from 1 to 20% by weight. If the content of a maleimide compound is within the range, the curing rate becomes superior.

Meanwhile, when a composition contains a maleimide compound in accordance with the present invention, the (meth)acrylic compound and the maleimide compound in a composition polymerize by a radical reaction by being heated to a predetermined temperature. In this case, only 1 kind of compound may polymerize to form a homopolymer, or two or more kinds of compounds may polymerize to form a copolymer.

<Filler>

A composition according to the present invention may contain a filler. By blending a filler, a composition for an electronic device having a low coefficient of linear expansion exhibiting superior dimensional stability and improved flame resistance can be obtained. As a filler, either of an insulating inorganic filler or an electrically conductive inorganic filler may be selected depending on the purpose of use. Examples of an insulating inorganic filler include silica, calcium silicate, aluminum hydroxide, magnesium hydroxide, calcium carbonate, magnesium carbonate, magnesium oxide, aluminum nitride, and boron nitride, and particularly silica is preferable. Examples of an electrically conductive inorganic filler include a metal and carbon black.

Further, a filler subjected to a surface modification according to need may be also used. Examples of commercial products include a lineup of "Mitsubishi carbon black" from Mitsubishi Chemical Corporation, "Asahi" series from Asahi Carbon Co., Ltd., calcium silicate "PCM Lite" series, aluminum hydroxide "ALH" series, and alumina-based "Celasule" from Kawai Lime Ind. Co., Ltd., titanium oxide "STR series", silica "Sciqus Series", zinc oxide "FINEEX series", magnesium oxide "SMO Series", and zirconium oxide "STR Series" from Sakai Chemical Industry Co., Ltd., silica, oxidized alumina "ADMAFINE" series from Admatechs Company Limited, silica "SNOWTEX" series from Nissan Chemical Ind., Ltd., and a metallic oxide containing silica and aluminum oxide "NanoTek" series from C.I. Kasei Co., Ltd.

When a composition according to the present invention is used for producing, for example, a semiconductor device, the average particle diameter of a filler is preferably smaller than the gap dimension between a semiconductor chip element formation surface and a wiring substrate. If the average particle diameter of a filler is too large, the filler may be trapped between metal connections in producing a semiconductor device, so that good electrical reliability may not be established, or a chip may break.

Although the blending amount of a filler may be adjustable depending on the purpose of use, it is preferably, for example, from 1 to 99% by weight based on the total weight of an adhesive composition, and more preferably from 10 to 80% by weight. If the content is within the range, a composition having a sufficient effect of filler addition and a viscosity free from any problem in handling can be obtained.

<Radical Initiator>

A composition according to the present invention contains preferably a radical initiator. As a radical initiator to be used according to the present invention, a thermal radical initiator is preferable. As a thermal radical initiator, an organic peroxide is preferable, and one that generates a radical at a convenient temperature is selected.

Although there is no particular restriction on a radical initiator, examples thereof include diisobutyl peroxide, cumyl peroxyneodecanate, di-n-propyl peroxycarbonate, diisopropyl peroxycarbonate, di-sec-butyl peroxycarbonate, 1,1,3,3-tetramethylbutyl peroxyneodecanate, di(4-t-butylcyclohexyl)peroxydicarbonate, di(2-ethylhexyl)peroxydicarbonate, t-hexyl peroxyneodecanate, t-butyl peroxyneodecanate, t-butyl peroxyneoheptanate, t-hexyl peroxypivalate, t-butyl peroxypivalate, di(3,5,5-trimethylhexanoyl)peroxide, dilauroyl peroxide, 1,1,3,3-tetramethylbutyl peroxy-2-ethyl hexanate, disuccinic acid peroxide, 2,5-dimethyl-2,5-di(2-ethylhexanoylperoxy)hexane, t-hexyl peroxy-2-ethyl hexanate, di(4-methyl benzoyl)peroxide, t-butylperoxy-2-ethyl hexanate, dibenzoyl peroxide, 1,1-di(t-butylperoxy)-2-methylcyclohexane, 1,1-di(t-hexylperoxy)-3,3,5-trimethyl cyclohexane, 1,1-di(t-hexylperoxy)cyclohexane, 1,1-di(t-butylperoxy)cyclohexane, 2,2-di(4,4-di-(t-butylperoxy)cyclohexyl)propane, t-hexylperoxy isopropyl monocarbonate, t-butyl peroxymaleic acid, t-butyl peroxy-3,5,5-trimethyl hexanate, t-butyl peroxylaurate, t-butyl peroxyisopropyl monocarbonate, t-butylperoxy 2-ethylhexyl monocarbonate, t-hexyl peroxybenzoate, 2,5-di-methyl-2,5-di(benzoyl peroxy)hexane, t-butyl peroxyacetate, 2,2-di(t-butylperoxy)butane, t-butyl peroxybenzoate, n-butyl-4,4-di-(t-butylperoxy)valerate, di(2-t-butyl peroxyisopropyl)benzene, dicumyl peroxide, di-t-hexyl peroxide, t-butyl cumyl peroxide, di-t-butyl peroxide, p-menthane hydroperoxide, 2,5-dimethyl-2,5-di(t-butylperoxy)hexane-3,3,5-diisopropylbenzene hydroperoxide, 1,1,3,3-tetramethyl butyl hydroperoxide, cumene hydroperoxide, t-butyl hydroperoxide, and 2,3-dimethyl-2,3-diphenyl butane. The organic peroxides can be purchased from Akzo Nobel N. V., Gio specialities Chemical, Arkema S. A., NOF Corporation, Kayaku Akzo Corporation, and the like. The same may be used singly, or in a combination of two or more kinds thereof.

The blending amount of a radical initiator is preferably from 0.01 to 10% by weight based on the total weight of a composition, and more preferably from 0.1 to 5% by weight. If the blending amount of a radical initiator is within the range, there occurs no problem of instability in applying the composition or of prolongation of a curing time.

In addition to the aforedescribed components, a composition according to the present invention may contain an additive as needed, such as a silane coupling agent, a rubber component, an antioxidant, a light stabilizer, a radical stabilizing agent, and a surfactant. A silane coupling agent and a rubber component can advantageously improve the adhesive property of a composition, relax a stress, and reduce warping of a cured reaction product. Meanwhile, an antioxidant, and a radical stabilizing agent may be used in order to extend the pot life. A surfactant may be added for defoaming in coating, or for improving the wettability to a target to be coated and the leveling property.

By blending a silane coupling agent to a composition the adhesive property of an adhesive can be improved.

Although there is no particular restriction on a silane coupling agent, examples thereof include an aminosilane coupling agent, an epoxy silane coupling agent, a ureide silane coupling agent, an isocyanate silane coupling agent, a vinyl silane coupling agent, a (meth)acrylic silane coupling agent, and a ketimine silane coupling agent, and among these, an isocyanate silane coupling agent, a (meth)acrylic silane coupling agent, and an epoxy silane coupling agent are preferable. The silane coupling agents can be purchased from Dow Corning Toray Silicone Co., Ltd., Shin-Etsu Silicone, Matsumoto Fine Chemical Co., Ltd., Tokyo Chemical Industry Co., Ltd. and the like.

Although the blending amount of a silane coupling agent is adjustable appropriately, it is preferably, for example, from 0 to 10% by weight based on the total weight of a composition, and more preferably from 0 to 5% by weight. If the content of a silane coupling agent is too high, a silane coupling agent vaporizes during thermal compression bonding in a flip chip process to develop voids.

Although there is no particular restriction on rubber, examples thereof include industrial rubbers, such as acrylic rubber, nitrile rubber, butadiene rubber, and nitrile butadiene rubber, and a low molecular weight crosslinking agent for rubber. Examples of commercial products for industrial rubbers include "Paracron RP" series from Negami Chemical Industrial Co., Ltd., "Staphyloid IM" series and "Staphyloid AC" series from Ganz Chemical Co., Ltd., "Zeon" series from Zeon Kasei Co., Ltd., and "METABLEN C/E/W/S/SX/SRX" from Mitsubishi Rayon Co., Ltd. Examples of commercial products for a low molecular weight crosslinking agent for rubber include "Ricon" series from Sartomer, "Poly bd" and "Poly ip" series, "EPOL" series, and "Krasol" from Idemitsu Kosan Co., Ltd., and "NISSO-PB" from Nippon Soda Co., Ltd. The products may be used singly or in a combination of two or more kinds thereof.

Further, a commercial product of an acrylic resin, in which a rubber particle has been dispersed in advance, may be used, and examples thereof include Paracron SN-50, AS-3000, ME-2000, W-1163, W-248E, W-197C, PRE-COAT 200, and PANLON S-2012 from Negami Chemical Industrial Co., Ltd.

Although the blending amount of rubber is adjustable appropriately, it is preferably, for example, from 0 to 30% by weight based on the total weight of an adhesive composition, and more preferably from 0 to 20% by weight. If the rubber content is too high, the viscosity of an adhesive composition increases too much causing such problems that the handling property may be deteriorated, or mixing of other components may become difficult, or the adhesiveness of an adhesive may be deteriorated.

Examples include for an antioxidant and a radical stabilizing agent hydroquinones, benzoquinones, and hindered phenols; and for a light stabilizer benzotriazole-based, triazine-based, benzophenone-based, benzoate-based, and hindered amine-based ultraviolet absorbers. A surfactant may be selected out of catalogs of commercial products depending on a purpose of use.

<Production Method of Composition for Electronic Device>

A composition according to the present invention can be obtained by mixing uniformly the above specified respective components, as well as a solvent according to need. A composition is only required that a viscosity thereof is adjusted as long as it can be applied by a coater such as a dispenser, and may be also solventless. It is also possible to adjust viscosity by selection of compounds in a composition, or by adjustment of the blending amounts thereof. A composition according to the present invention can be produced by kneading uniformly predetermined amounts of the respective components by, without limitation thereto, using singly or in a combination of publicly known various kneading machines, such as a homo-disperser, a universal mixer, a Banbury mixer, a kneader, a twin roll mill, a triple roll mill, and an extruder. Kneading may be conducted under various conditions, such as at normal temperature or with heating, at a normal pressure, a reduced pressure, or an increased pressure, or with inert gas flow.

A composition for an electronic device according to the present invention is used preferably for an electronic device, particularly as an underfill sealant (sealant) in a device including a semiconductor chip, but without limitation thereto.

<Electronic Device and Production Method of the Same>

Next, a production method of an electronic device comprising a composition according to the present invention will be described. Although there is no particular restriction on a production method of an electronic device, a flip chip process is preferably used. In a flip chip process, it is particularly preferable to coat a circuit face of a wiring substrate with a composition according to the present invention. A production method of an electronic device comprises, for example, (1) a coating process for coating a circuit face of a wiring substrate with a composition according to the present invention, and (2) a bonding and sealing process for placing a semiconductor chip on the composition applied on the wiring substrate, and performing electrical connection between the semiconductor chip and the wiring substrate and seal of a gap therebetween. The respective processes will be described below.

<(1) Coating Process>

In the coating process, a composition according to the present invention is applied on a circuit face of a wiring substrate. All over the surface of a wiring substrate or only a part where a semiconductor chip is to be mounted may be coated with the composition. Examples of a coating method include coating methods using a spin coater, a dispenser, a roller, and the like and screen printing. In this connection, a syringe used in the coating process, a substrate, and the like may be heated to room temperature or higher as needed so as to improve the flowability of the composition.

<(2) Bonding and Sealing Process>

In the bonding and sealing process, electrical connection between the semiconductor element and the wiring substrate is performed, and simultaneously a gap between the semiconductor element and the circuit substrate is sealed with a composition according to the present invention to produce an electronic device. Firstly, a semiconductor chip is placed on a part coated with an adhesive composition on a wiring substrate. On this occasion, a circuit face of the wiring substrate (namely, a face coated with the composition in the coating process) and an element formation surface of the semiconductor chip are so aligned that the two face each other. Then, thermal compression bonding is followed. Heating may be performed additionally after the thermal compression bonding in order to cure the adhesive composition. In general, as a method for thermal compression bonding and connection, thermal compression bonding is performed immediately after position adjustment using a flip chip bonder, or after position adjustment and provisional mounting, heating connection is performed in a reflow oven and the like. On this occasion, a thermal profile suitable for a package or a sealing method is applied. Further, for chip mounting, not only a flip chip bonder, a die bonder and the like, with which position adjustment is possible, may be also used alternatively.

There is no particular restriction on the temperature for thermal compression bonding. When an electrode is a solder bump or a solder cap bump, a temperature higher than the melting point by 10 to 100° C. is preferable, 200° C. or higher is preferable, and 210 to 300° C. is more preferable. The duration time for thermal compression bonding is preferably from 1 to 20 sec, and the pressure is preferably from 0.1 to 7 MPa. Further, if additional heating is performed for curing completely an adhesive composition after the thermal compression bonding, for example, 150 to 220° C. for 30 to 180 min are preferable.

An electronic device obtained as above can be applied to various electronic appliances utilizing a semiconductor chip, such as a cell phone, a personal computer, and a TV.

EXAMPLES

The present invention will be described below in more details by way of Examples. However, the present invention is not restricted by the following Examples.

Table 1 shows compounds used in the following Examples and Comparative Examples.

TABLE 1

| Component | Name of source material | Description of compound |
|---|---|---|
| (Meth)acrylate | CN120 (produced by Sartomer) | Epoxy acrylate oligomer |
| | SR9003 (produced by Sartomer) | Propoxylated neopentyl glycol diacrylate |
| | SR480 (produced by Sartomer) | Ethoxylated bisphenol A dimethacrylate |
| | SR444 (produced by Sartomer) | Pentaerythritol triacrylate |
| Maleimide | LUMICURE MIA200 produced by DIC Corporation | Polyalkylene maleimide acetate |
| Thermal radical initiator | Perbutyl Z (produced by NOF Corporation) | t-butyl peroxybenzoate |
| Filler | SE-2030 (produced by Admatechs Co., Ltd.) | Silica |
| Coupling agent | KBM-503 (produced by Shin-Etsu Chemical Co., Ltd.) | 3-Methacryloxypropyltrimethoxysilane |
| Isocyanuric acid having allyl group | TAIC (registered trademark) (produced by Nippon Kasei Chemical Co., Ltd.) | Triallyl isocyanurate |
| | TAIC (registered trademark) Prepolymer (produced by Nippon Kasei Chemical Co., Ltd.) | Powder not volatile during high temperature crosslinking, prepared by prepolymerizing TAIC (registered trademark) |
| | TMAIC (registered trademark) (produced by Nippon Kasei Chemical Co., Ltd.) | Trimethallyl isocyanurate |
| | DA-MGIC (produced by Shikoku Chemicals Corporation) | Diallyl monoglycidyl isocyanurate |
| | MA-DGIC (produced by Shikoku Chemicals Corporation) | 1-Allyl-3,5-diglycidyl isocyanurate |
| | Diallyl isocyanurate (produced by Tokyo Chemical Industry Co., Ltd.) | |
| | Diallyl propyl isocyanurate (produced by Tokyo Chemical Industry Co., Ltd.) | |

Apparatus and the like used in the following Examples and Comparative Examples are as follows (1) Circuit substrate: WALTS-KIT MB50-0102JY_CR from Waits Co., Ltd. Pads are according to CuOSP specifications.

(2) Semiconductor chip: WALTS-TEG MB50-0101JY with 544 bumps constituted with a Cu pillar and solder from Waits Co., Ltd.

(The circuit substrate (1) and the semiconductor chip (2) are connected together to form a daisy chain, and when all the bumps in a chip are connected, the continuity can be established. In other words, if a single bump out of 544 bumps cannot be connected, electrical insulation is recognized by an electrical continuity test.)

<Preparation of Adhesive Composition for Underfill Sealant>

The relevant components were mixed by the following method to prepare an adhesive composition. Table 2 shows compounds blended in the respective Examples and Comparative Examples and the blending amounts thereof (% by weight).

TABLE 2

| | | Example | | | | | | | | | Comparative Example | |
|---|---|---|---|---|---|---|---|---|---|---|---|---|
| | | 1 | 2 | 3 | 4 | 5 | 6 | 7 | 8 | 9 | 1 | 2 |
| (Meth)acrylic compound | CN120 | 5 | 5 | 5 | 5 | 5 | 5 | 5 | 5 | 15 | 5 | 6 |
| | SR9003 | 10 | 10 | 10 | 10 | 10 | 10 | 10 | 10 | 10 | 15 | 11 |
| | SR480 | 10 | 10 | 10 | 10 | 10 | 10 | 10 | 10 | 10 | 15 | 11 |
| | SR444 | 10 | 10 | 10 | 10 | 10 | 10 | 10 | 10 | 10 | 15 | 11 |
| Maleimide compound | MIA200 | 10 | 10 | 10 | 10 | 10 | 10 | 10 | 10 | 0 | 0 | 11 |

TABLE 2-continued

|  |  | Example | | | | | | | | | Comparative Example | |
|---|---|---|---|---|---|---|---|---|---|---|---|---|
|  |  | 1 | 2 | 3 | 4 | 5 | 6 | 7 | 8 | 9 | 1 | 2 |
| Coupling agent | KBM-503 | 0.3 | 0.3 | 0.3 | 0.3 | 0.3 | 0.3 | 0.3 | 0.3 | 0.3 | 0.3 | 0.3 |
| Filler | SE2030 | 49.5 | 49.5 | 49.5 | 49.5 | 49.5 | 49.5 | 49.5 | 49.5 | 49.5 | 49.5 | 49.5 |
| Radical initiator | Perbutyl Z | 0.2 | 0.2 | 0.2 | 0.2 | 0.2 | 0.2 | 0.2 | 0.2 | 0.2 | 0.2 | 0.2 |
| Isocyanuric acid having allyl group | TAIC | 5 | 0 | 0 | 0 | 0 | 0 | 0 | 0 | 0 | 0 | 0 |
|  | TAIC Prepolymer | 0 | 5 | 0 | 0 | 0 | 0 | 0 | 0 | 0 | 0 | 0 |
|  | TMAIC | 0 | 0 | 5 | 0 | 0 | 0 | 0 | 0 | 0 | 0 | 0 |
|  | DA-MGIC | 0 | 0 | 0 | 5 | 0 | 0 | 0 | 0 | 0 | 0 | 0 |
|  | MA-DGIC | 0 | 0 | 0 | 0 | 5 | 0 | 0 | 0 | 0 | 0 | 0 |
|  | MeDAIC | 0 | 0 | 0 | 0 | 0 | 5 | 0 | 0 | 0 | 0 | 0 |
|  | Diallyl isocyanurate | 0 | 0 | 0 | 0 | 0 | 0 | 5 | 0 | 0 | 0 | 0 |
|  | Diallyl propyl isocyanurate | 0 | 0 | 0 | 0 | 0 | 0 | 0 | 5 | 5 | 0 | 0 |
| Total |  | 100 | 100 | 100 | 100 | 100 | 100 | 100 | 100 | 100 | 100 | 100 |

(The unit of the number is weight %.)

Example 1

Preparation of Composition

Compounds listed in Table 2 were weighed out according to the designated blending amounts and kneaded uniformly by a triple roll mill. The product was degassed in vacuum to prepare an adhesive composition A.

After heating a circuit substrate in an oven at 120° C. for 1 hour, the composition A was applied on a circuit substrate with an autodispenser to obtain a circuit substrate B coated with the adhesive composition A.

(Mounting of Electronic Device)

Immediately after preparation of the circuit substrate B (heat exposure time 0 min), or after being left standing on a hot plate at 80° C. for 15 min, 30 min, 45 min, 60 min, or 90 min, the position of a semiconductor chip and the circuit substrate B was adjusted and the two were pressed together using a flip chip bonder equipped with a pulse heat function, followed by thermal compression bonding with pulse heating at 240° C. Thereafter, the composition A was cured in an oven at 150° C. for 1 hour to complete an electronic device C.

(Electrical Continuity Test)

The electrical continuity of the above produced electronic device C was examined to find that the electrical continuity was good with respect to any heat exposure time on the hot plate at 80° C. (Table 3). Namely, all of the 544 bumps on the semiconductor chip were connected. Therefore, it was demonstrated that the composition in Example 1 maintained liquidity sufficient for processing, even if the same was left standing on a hot plate at 80° C.

TABLE 3

| Time for being left | Electrical continuity |
|---|---|
| 0 minutes | good |
| 15 minutes | good |
| 30 minutes | good |
| 45 minutes | good |
| 60 minutes | good |
| 90 minutes | good |

Examples 2 to 9

Electronic devices were produced by the same method as in Example 1, except that the components to be blended in the compositions were changed as shown in Table 2. Also in Examples 2 to 9, circuit substrates coated with the compositions were left standing at 80° C. for 0 min, 15 min, 30 min, 45 min, 60 min, and 90 min, then electronic devices were produced, and the electrical continuity thereof were examined. As the results, for all the cases, good electrical continuity was obtained. Therefore, it was demonstrated that the compositions in Examples 2 to 9 also maintained liquidity sufficient for processing, even if the same were left standing on a hot plate at 80° C.

Comparative Example 1

An electronic device was produced by the same method as in Example 1, except that the components to be blended in a composition were changed as shown in Table 2 and a maleimide compound and an isocyanuric acid having an allyl group were not blended. Also in Comparative Example 1, circuit substrates coated with the composition were left standing at 80° C. for 0 min, 15 min, 30 min, 45 min, 60 min, and 90 min, then electronic devices were produced, and the electrical continuity thereof were examined. As the results, good electrical continuity of an electronic device produced without being left standing at 80° C. (heat exposure time 0 min) was confirmed, however in all other cases, electrical continuity was not established (Table 4). Therefore, it was demonstrated that curing of the composition in Comparative Example 1 had progressed by being left standing at 80° C., and good electrical continuity could not be established.

TABLE 4

| Time for being left | Electrical continuity |
|---|---|
| 0 minutes | good |
| 15 minutes | unconnected |
| 30 minutes | unconnected |
| 45 minutes | unconnected |
| 60 minutes | unconnected |
| 90 minutes | unconnected |

Comparative Example 2

An electronic device was produced by the same method as in Example 1, except that the components to be blended in a composition were changed as shown in Table 2 and an isocyanuric acid having an allyl group was not blended. Also in Comparative Example 2, the electrical continuity was examined as in Example 1. As the results, good electrical continuity of an electronic device produced without being left standing at 80° C. (heat exposure time 0 min) was confirmed, however in all other cases (left standing at 80° C.), electrical continuity was not established. It was confirmed that curing of the composition in Comparative Example 2 had also progressed by being left standing at 80° C., and good electrical continuity could not be established.

The invention claimed is:

1. An underfill sealant composition comprising:
   (a) a (meth)acrylic compound,
   (b) a maleimide compound, and
   (c) an isocyanuric acid having an allyl group, wherein the maleimide compound (b) comprises a bismaleimide;
   the composition further comprising a thermal radical initiator.

2. The composition according to claim 1 wherein
   the (meth)acrylic compound (a) is 10-90 wt % based on the total weight of the composition and
   the isocyanuric acid having an allyl group (c) is 0.001-20 wt % based on the total weight of the composition.

3. The composition according to claim 1, wherein the maleimide compound (b) is 0.1-50 wt % of based on the total weight of the composition.

4. A process for using a composition according to claim 1, to form an electronic device, steps of which comprise:
   providing a semiconductor chip;
   providing a wiring substrate with a circuit face in alignment with the semiconductor chip;
   providing the composition therebetween; and
   exposing the composition to elevated temperature conditions sufficient to cure the composition.

5. An electronic device comprising a cured product of the composition according to claim 1.

6. An electronic appliance comprising the electronic device according to claim 5.

7. The process of claim 4, wherein exposing the composition to elevated temperature conditions sufficient to cure the composition is conducted under thermal compression bonding conditions.

* * * * *